United States Patent
Tille et al.

(10) Patent No.: US 6,700,149 B2
(45) Date of Patent: Mar. 2, 2004

(54) CIRCUIT CONFIGURATION FOR FORMING A MOS CAPACITOR WITH A LOWER VOLTAGE DEPENDENCE AND A LOWER AREA REQUIREMENT

(75) Inventors: Thomas Tille, München (TW); Doris Schmitt-Landsiedel, Ottobrunn (DE); Jens Sauerbrey, München (DE)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 10/113,421

(22) Filed: Apr. 1, 2002

(65) Prior Publication Data

US 2002/0135044 A1 Sep. 26, 2002

Related U.S. Application Data

(63) Continuation of application No. PCT/DE00/03479, filed on Sep. 29, 2000.

(30) Foreign Application Priority Data

| Sep. 30, 1999 | (DE) | 199 46 977 |
| Sep. 30, 1999 | (DE) | 199 47 116 |
| Dec. 20, 1999 | (DE) | 199 61 487 |

(51) Int. Cl.$^7$ .......................... H01L 27/088
(52) U.S. Cl. .............. 257/296; 257/300; 257/312; 327/566; 327/581
(58) Field of Search ............... 257/296, 300, 257/312; 327/566, 581

(56) References Cited

U.S. PATENT DOCUMENTS

| 4,268,951 A | * | 5/1981 | Elliott et al. ............ 438/289 |
| 4,453,090 A | | 6/1984 | Sempel ..................... 327/566 |
| 5,576,565 A | | 11/1996 | Yamaguchi ............... 257/296 |
| 5,801,411 A | | 9/1998 | Klughart .................. 257/296 |
| 5,926,064 A | | 7/1999 | Hariton .................... 327/581 |
| 6,028,473 A | * | 2/2000 | Kamei et al. ............ 327/536 |
| 6,472,233 B1 | * | 10/2002 | Ahmed et al. .............. 438/14 |

FOREIGN PATENT DOCUMENTS

| DE | 198 43 482 A1 | 8/1999 |
| EP | 0 290 857 A1 | 11/1988 |
| EP | 0 354 193 A2 | 2/1990 |
| EP | 0 720 238 A2 | 7/1996 |
| JP | 05 082 741 | 4/1993 |
| JP | 07 221 599 | 8/1995 |

OTHER PUBLICATIONS

Charles L. Cohen: "Vertical FET Gives NTT Twice The Chip Density", Electronics, vol. 46, Nov. 18, 1985, p. 25.

Hirokazu Yoshizawa et al.: "MOSFET–Only Switched–Capacitor Circuits in Digital CMOS Technology", IEEE Journal of Solid–State Circuits, vol. 34, No. 6, Jun. 1999– pp. 734–747.

Yunteng Huang et al.: „A High–Linearity Low–Voltage All–MOSFET Delta–Sigma Modulator, IEEE Custom Integrated Circuits Conference, 1997, pp. 293–296.

(List continued on next page.)

Primary Examiner—George Eckert
(74) Attorney, Agent, or Firm—Laurence A. Greenberg; Werner H. Stemer; Gregory L. Mayback

(57) ABSTRACT

A circuit configuration for providing a capacitance includes short-channel MOS transistors that are reverse-connected in series or in parallel, and that have the same channel type. When the short-channel MOS transistors are operated exclusively in the depletion mode in the required voltage range, the useful capacitance is increased, because of intrinsic capacitances, as compared with circuit configurations having conventional long-channel MOS transistors. These circuits greatly reduce the area taken up and reduce the costs.

4 Claims, 7 Drawing Sheets

OTHER PUBLICATIONS

Hirokazu Yoshizawa et al.: "MOSFET–Only Switched–Capacitor Circuits in Digital CMOS Technologies", 1997 IEEE International Symposium on Circuits and Systems, Jun. 9–12, 1997, Hong Kong, pp. 457–460.

Hirokazu Yoshizawa et al.: "Novel Design Techniques for High–Linearity MOSFET–Only Switched–Capacitor Circuits", 1996 Symposium on VLSI Circuits Digest of Technical Papers, pp. 152–153.

Hirokazu Yoshizawa et al.: "High–Linearity Switched–Capacitor Circuits in Digital CMOS Technology", 1995 IEEE International Symposium on Circuits and Systems, pp. 1029–1032.

S.M. Sze: "Physics of Semiconductor Devices", $2^{nd}$ edition, 1981, John Wiley & Sons, New York, pp. 369–372.

BSIM3v3 Manual, UC Berkeley, 1996. BSIM3v3.2 Model Enhancement Relative to BSIM3v3.1, 1998. This reference can be viewed under http://www.device.EECS.Berkeley.edu/~bsim3.

* cited by examiner

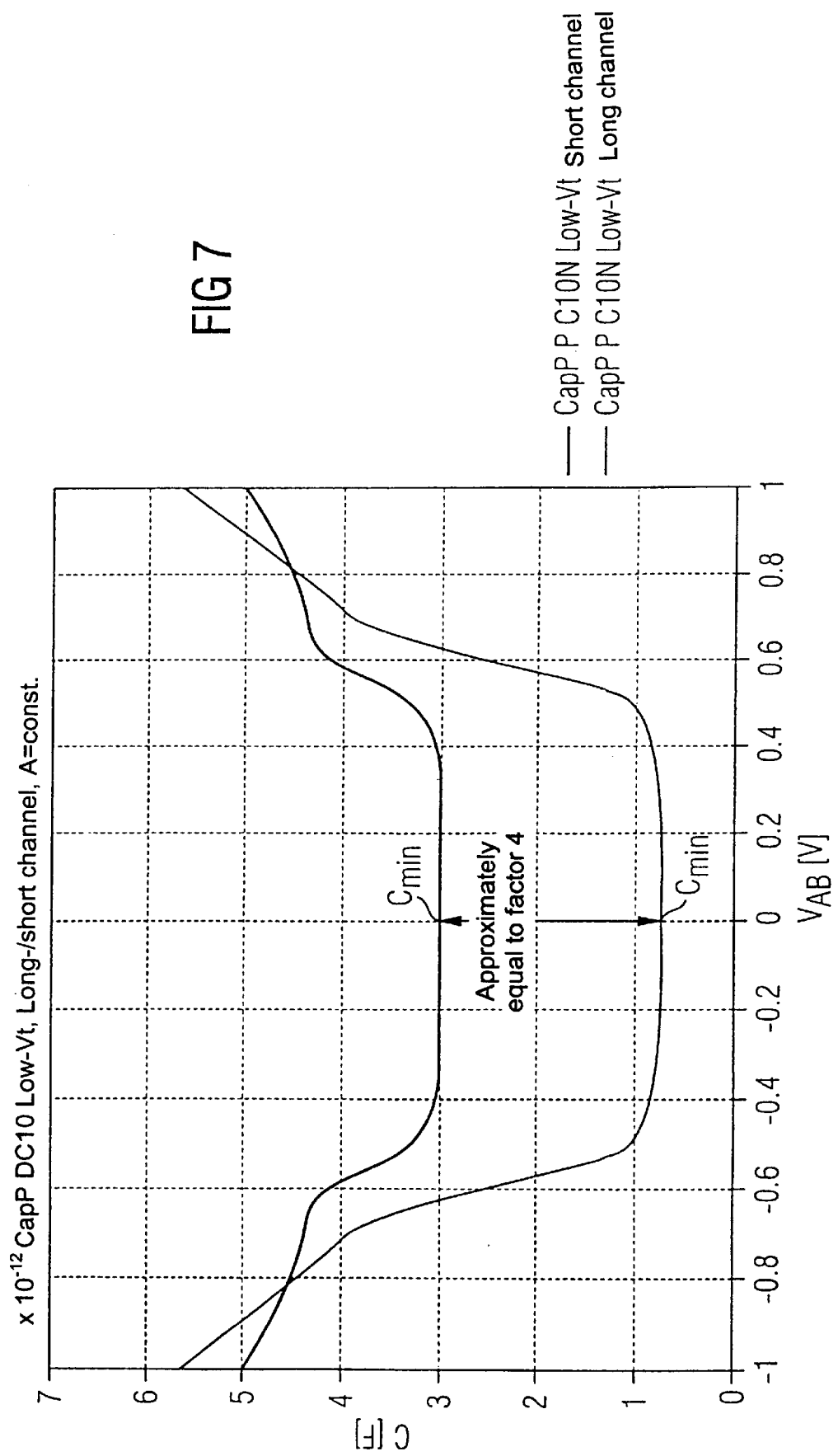

CIRCUIT CONFIGURATION FOR FORMING A MOS CAPACITOR WITH A LOWER VOLTAGE DEPENDENCE AND A LOWER AREA REQUIREMENT

CROSS-REFERENCE TO RELATED APPLICATION

This application is a continuation of copending International Application No. PCT/DE00/03479, filed Sep. 29, 2000, which designated the United States.

BACKGROUND OF THE INVENTION

Field of the Invention

The invention relates to a circuit configuration for forming an MOS capacitor with a low voltage dependence.

In MOS circuits (metal oxide semiconductor circuits), it is known to realize capacitors using MOS transistors. In this case, the capacitors are formed by a gate terminal, a gate oxide and a substrate. Compared with polysilicon/oxide/polysilicon capacitors, polysilicon/oxide/metal capacitors, and metal/oxide/metal capacitors, the MOS capacitor requires a lower area and has lower fabrication costs. The disadvantage resides in the voltage dependence of the capacitance profile, which limits the voltage range over which the MOS capacitor can be used.

Published European Patent Application EP 0 720 238 discloses a circuit configuration in which this voltage dependence is reduced using two series-connected MOS transistors. The transistors that are used are each operated in accumulation or inversion. For small operating voltages, however, this principle cannot be used or can only be used to a limited extent. In present CMOS processes, moreover, the gate capacitance is also voltage-dependent in accumulation and inversion.

The Digest of Technical Papers for the 1996 Symposium on VLSI circuits, pages 152 and 153, "Novel Design Techniques for High-Linearity MOSFET-Only Switched-Capacitor Circuits", Yoshizawa, Temes et al., discloses "parallel compensation" for MOS transistors in which all that is present is a parallel circuit of two series-connected MOS transistors that are each operated in accumulation or inversion.

U.S. Pat. No. 5,801,411 discloses an integrated capacitor structure that is constructed from a combination of MOS transistors that are connected in parallel and operated in depletion. This structure is designed for use with small operating voltages. The relatively large area required by the transistors, and thus by the entire arrangement is disadvantageous.

SUMMARY OF THE INVENTION

It is accordingly an object of the invention to provide a circuit configuration for forming a MOS capacitor which overcomes the above-mentioned disadvantages of the prior art apparatus of this general type.

In particular, it is an object of the invention to provide a circuit configuration for forming an MOS capacitor that requires only very small operating voltages to ensure a sufficient functionality of the circuit, and that can be realized in a particularly space-saving manner.

With the foregoing and other objects in view there is provided, in accordance with the invention, a circuit configuration for forming an MOS capacitor with a low voltage dependence. The circuit configuration includes: a first MOS transistor having a drain terminal and a source terminal; and a second MOS transistor having a drain terminal and a source terminal. The drain terminal of the first MOS transistor is connected to the source terminal of the first MOS transistor. The drain terminal of the second MOS transistor is connected to the source terminal of the second MOS transistor. The first MOS transistor is a short-channel transistor having a channel length not greater that 1 $\mu$m. The second MOS transistor is a short-channel transistor having a channel length not greater that 1 $\mu$m.

In accordance with an added feature of the invention, the first MOS transistor and the second MOS transistor are operated in depletion.

In accordance with an additional feature of the invention, the first MOS transistor having a given channel type, a bulk terminal, and a gate; the second MOS transistor having the given channel type, a bulk terminal, and a gate; and the first MOS transistor is connected to the second MOS transistor in either a first manner or a second manner. In the first manner, the bulk terminal of the first MOS transistor and the bulk terminal of the second MOS transistor define interconnected terminals that are connected together. In the second manner, the gate of the first MOS transistor and the gate of the second MOS transistor define interconnected terminals that are connected together. The first MOS transistor and the second MOS transistor are reverse-connected in series. The first MOS transistor has a depletion region that is widened by a first potential difference. The second MOS transistor has a depletion region that is widened by a second potential difference. The first potential difference is connected between the interconnected terminals (the interconnected terminals are dependent upon whether the transistors are connected in the first manner or the second manner) and the drain terminal of the first MOS transistor. The second potential difference is connected between the interconnected terminals and the drain terminal of the second MOS transistor.

In accordance with a further feature of the invention, there is provided, a first terminal and a second terminal; the first MOS transistor having a bulk terminal, and a gate; the second MOS transistor having a bulk terminal, and a gate; the first MOS transistor and the second MOS transistor being reverse-connected in parallel; the bulk terminal of the first MOS transistor being connected to the gate of the second MOS transistor and to the second terminal; the bulk terminal of the second MOS transistor being connected to the gate of the first MOS transistor and to the first terminal; the first MOS transistor having a depletion region being widened by a first potential difference; the second MOS transistor having a depletion region being widened by a second potential difference; the first potential difference being connected between the drain terminal of the first MOS transistor and the bulk terminal of the first MOS transistor; and the second potential difference being connected between the drain terminal of the second MOS transistor and the gate terminal of the second MOS transistor.

The invention essentially consists in the providing a circuit configuration for forming an MOS capacitor with transistors designed as so-called short-channel MOS transistors whose channel length is less than or equal to 1 $\mu$m, as a result of which, in addition to the intrinsic capacitances, extrinsic capacitances are also used for forming the MOS capacitor. The utilization of the extrinsic capacitances is beneficial primarily in the case of compensated MOS capacitors that are operated in depletion. This means, in particular, for compensation circuits operated in depletion, a considerably reduced outlay on area.

Furthermore, the circuit configuration provides advantages over polysilicon/oxide/polysilicon capacitors, polysilicon/oxide/metal capacitors, and metal/oxide/metal capacitors in view of their area and cost-intensive additional process layers. Consequently, it is possible to fabricate, in particular, analog circuits for low supply voltages together with digital circuits as a "single-chip solution" inexpensively in a single process.

Other features which are considered as characteristic for the invention are set forth in the appended claims.

Although the invention is illustrated and described herein as embodied in a circuit configuration for forming a MOS capacitor with a lower voltage dependence and a lower area requirement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 is capacitance/voltage diagram for comparing the capacitance obtained with short-channel transistors and with long-channel transistors in the circuit configuration shown in FIG. 6.

DESCRIPTION OF THE PREFERRED EMBODIMENTS

Figure 1:
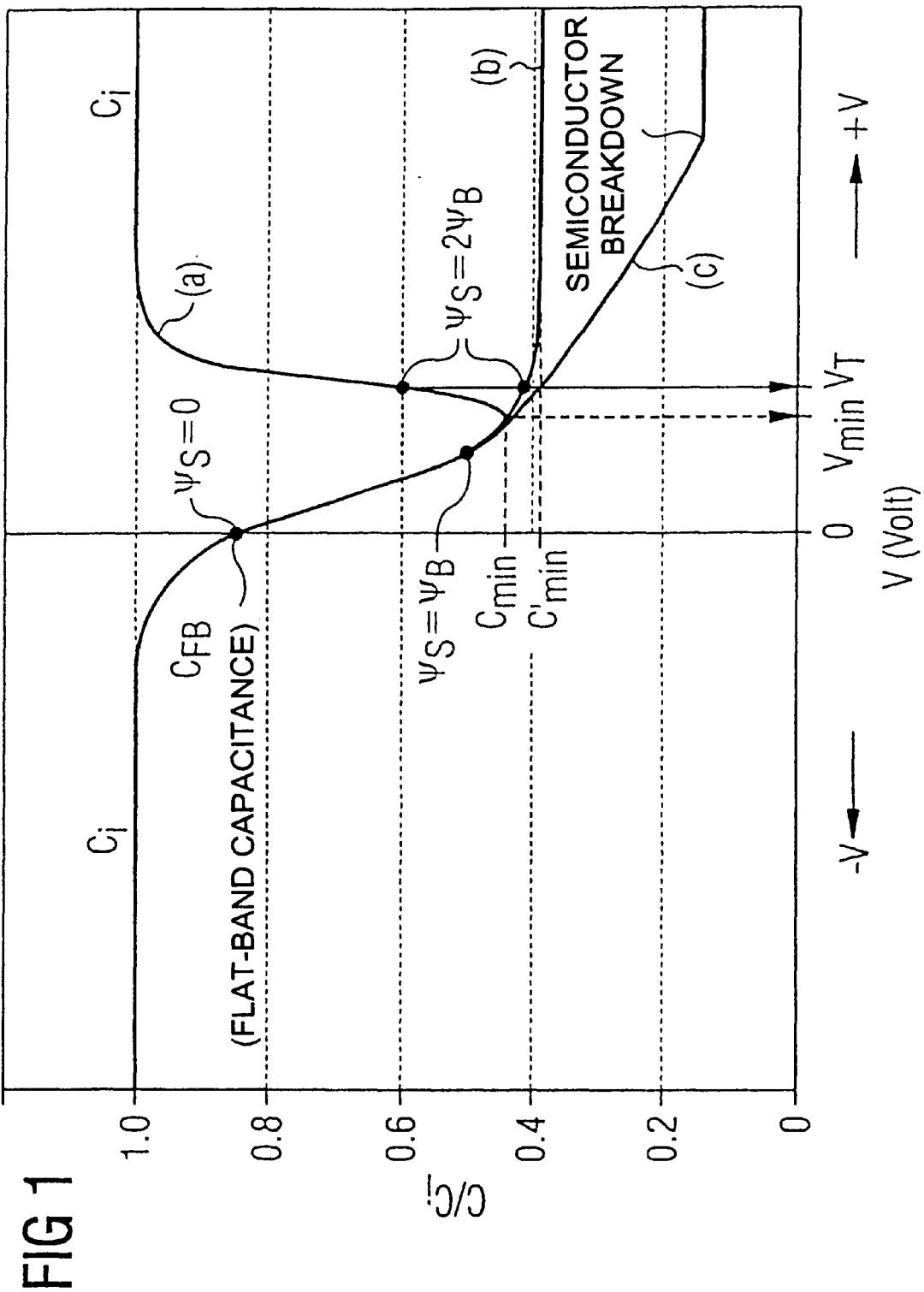
FIG. 1 shows a typical capacitance/voltage profile of a prior art MOS capacitor.

Referring now to the figures of the drawing in detail and first, particularly, to FIG. 1 thereof, there is shown a typical capacitance/voltage profile of a prior art MOS capacitor (according to S. M. Sze, "Physics of Semiconductor Devices", second edition, John Wiley and Sons, New York, Chichester, Brisbane, Toronto, p. 371, 1981). As can be seen from profile (a) in FIG. 1, an MOS capacitor including a gate terminal, a gate oxide and a substrate has a voltage-dependent capacitance profile that depends on its operating range. For the example presented here, the source, the drain and the well terminals of a p-channel MOS transistor have been connected together. In accordance with the gate-bulk voltage $V_{GB}$ present, the MOS capacitor typically behaves in a highly non-linear fashion. In the case of a gate-bulk voltage greater than the flat-band voltage, the CMOS transistor is turned off (accumulation), and the MOS capacitance is essentially determined by the thickness of the gate oxide. If the gate-bulk voltage is reduced, then the region below the gate oxide is depleted of mobile charge carriers and a depletion layer forms (depletion). In this case, the MOS capacitance is essentially determined by the thickness of the depletion layer and the thickness of the gate oxide. If the gate-bulk voltage falls below the threshold voltage of the MOS transistor, then an inversion layer or a p-channel forms below the gate oxide (inversion) and the MOS capacitance is essentially determined by the thickness of the gate oxide.

Figure 2:
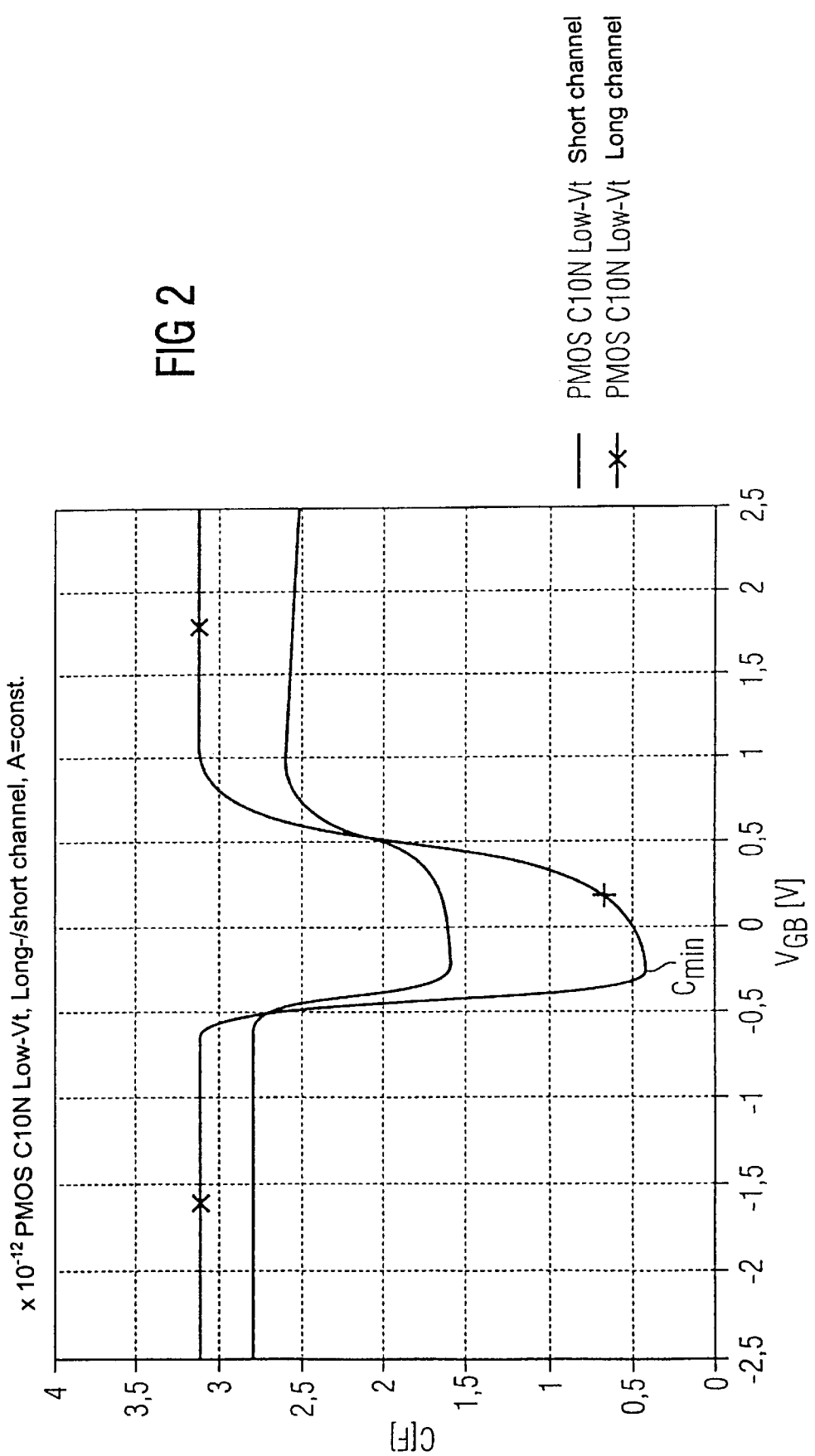
FIG. 2 is a plot of the capacitance against the gate-bulk voltage for a circuit configuration with short-channel transistors compared with that for a corresponding circuit configuration with customary long-channel transistors.

FIG. 2 is a diagram in which the useful capacitance C that can be obtained is plotted against the gate-bulk voltage $V_{GB}$ for a circuit configuration with short-channel transistors and for a corresponding circuit configuration with customary long-channel transistors. In this case, the short-channel transistors are understood to be MOS transistors with a channel length approaching the minimum channel length that can be realized in the corresponding technology. These transistors typically have a channel length of less than or equal to approximately 1 $\mu$m for a 0.18 $\mu$m process, for example. In short-channel MOS transistors, extrinsic capacitance components additionally contribute to the total capacitance, since with a short channel length, the area of the gate/source and gate/drain overlapping zone has a great influence on the total capacitance that results. Furthermore, it becomes clear from FIG. 2 that in the region around 0 volts, the short-channel transistors provide a more constant and larger useful capacitance than in the case of a corresponding circuit configuration with long-channel transistors.

Figure 3:
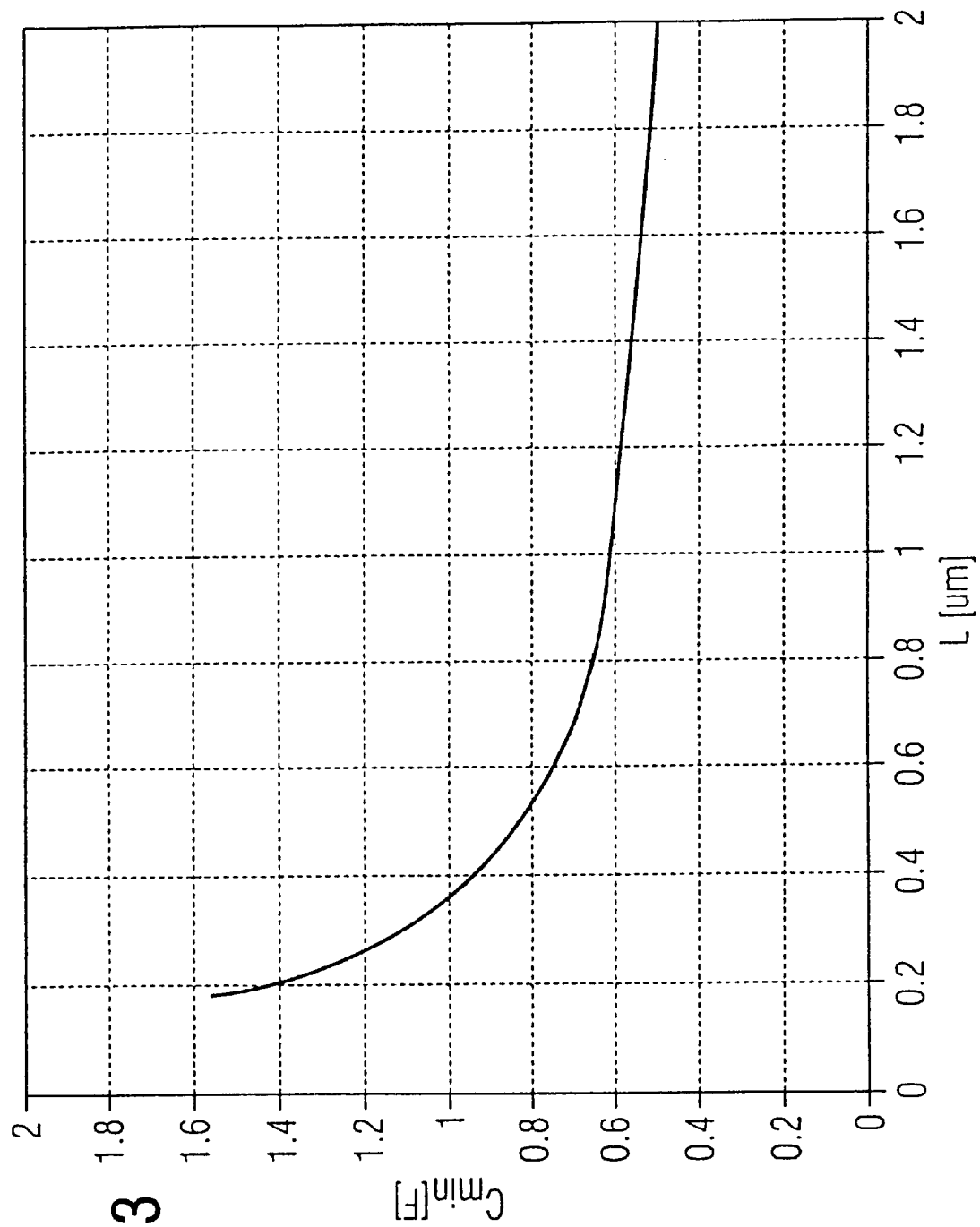
FIG. 3 is a diagram showing the minimum capacitance that can be produced as a function of the channel length of the MOS transistors in a circuit configuration.

FIG. 3 illustrates a minimum capacitance $C_{min}$ as a function of the channel length L. The capacitance greatly rises as the channel length decreases from approximately 1 $\mu$m. With decreasing channel length, the influence of the extrinsic capacitance components increases and the useful capacitance is in this case essentially formed not only by the gate oxide and the depletion layer, but also by the gate/source and gate/drain overlap zones. The capacitances resulting from the overlap zones can in each case be subdivided into a virtually voltage-independent component between the gate and HDD zone (heavily doped diffusion area) and into a slightly voltage-dependent component between the gate and LDD zone (Lightly Doped Diffusion area). In contrast, the gate/bulk overlap capacitances can be disregarded because of their small size in relation to the total capacitance. In the case of short channel lengths, the depth of the depletion dip greatly decreases. In other words, the minimum capacitance $C_{min}$ that is crucial for the nominal capacitance of compensation circuits operated in depletion, increases by a multiple in the depletion dip, which results in a great increase in the effective useful capacitance per area.

Figure 4:
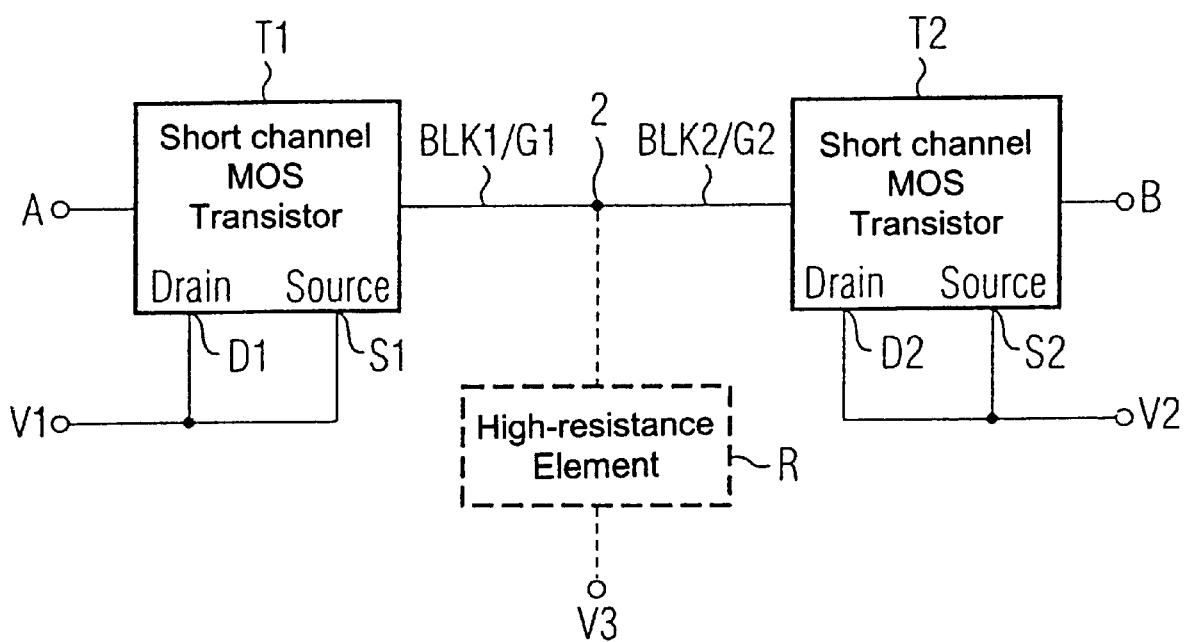
FIG. 4 shows a first circuit configuration for compensating for the voltage dependence of MOS capacitors.
Figure 6:
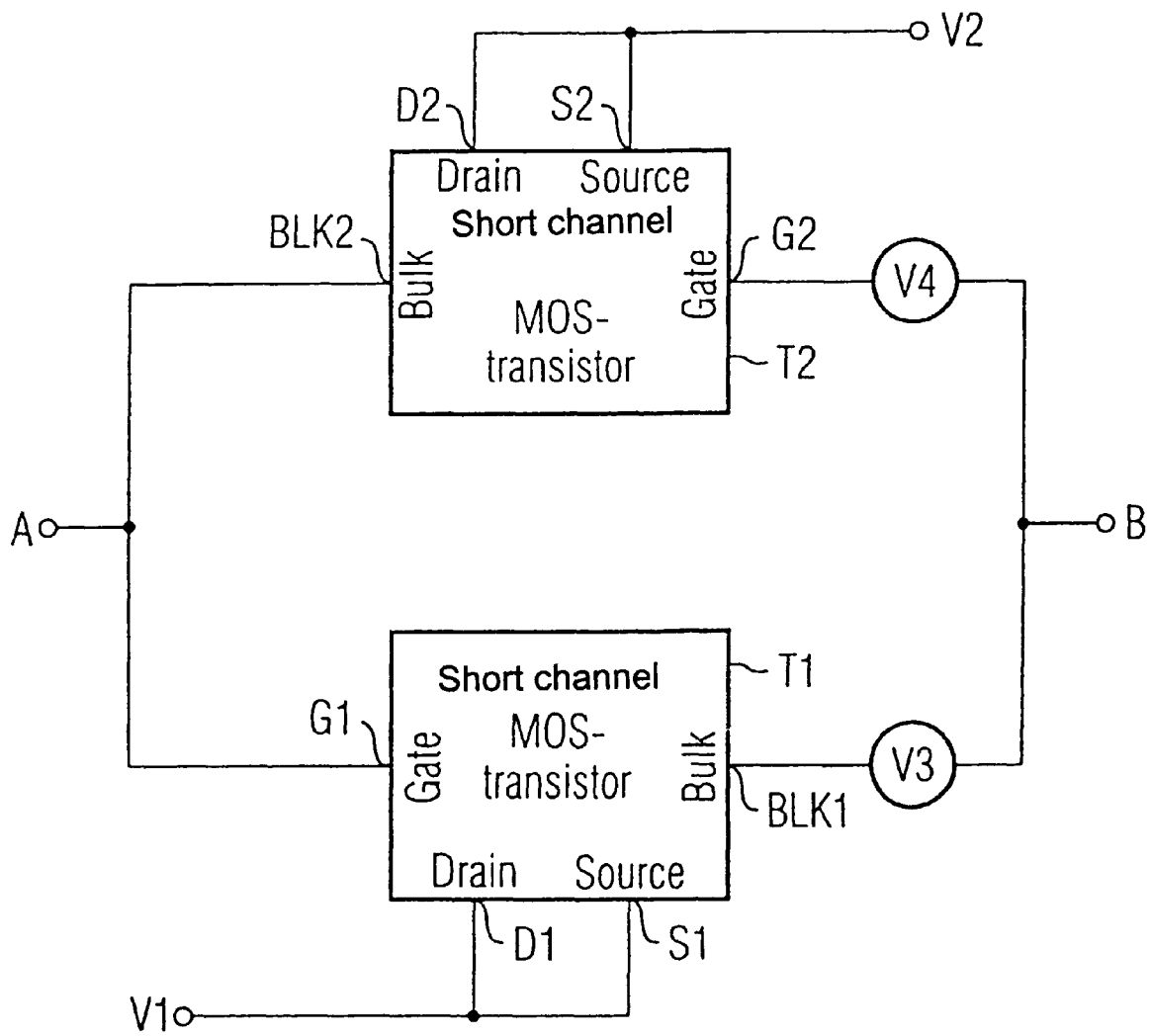
FIG. 6 shows a second circuit configuration for compensating for the voltage dependence of MOS capacitors.

FIGS. 4 and 6 illustrate a first and second inventive circuit configuration for compensation, in which the drain and source terminals D1, S1 and D2, S2 of the respective MOS transistors T1, T2 are connected to one another and are biased relative to a respective gate G1, G2 or bulk BLK1, BLK2 in such a way that the MOS transistors operate exclusively in the depletion region in the required voltage range in each case.

In FIG. 4, the MOS transistors T1 and T2 are reverse-connected in series. Either the gate of one transistor is connected to the gate of the other transistor, or the bulk of one transistor is connected to the bulk of the other transistor. The useful capacitance lies between the bulk or gate terminals, terminals A and B, which are in each case not connected.

In the chosen operating range, it is not critical to have a defined potential at the node 2 between the MOS transistors that are reverse-connected in series, but is recommended to avoid charging, since it is thereby possible to prevent the operating range from drifting or a gate breakdown. In the case of a gate-coupled arrangement, a high-resistance element R, for example, a so-called "Bleeder", with respect to fixed potential V3 is advantageous for preventing gate charging. This provides the advantage that abrupt potential equalization of the gate node does not take place, which may be useful for specific circuitry applications.

Figure 5:
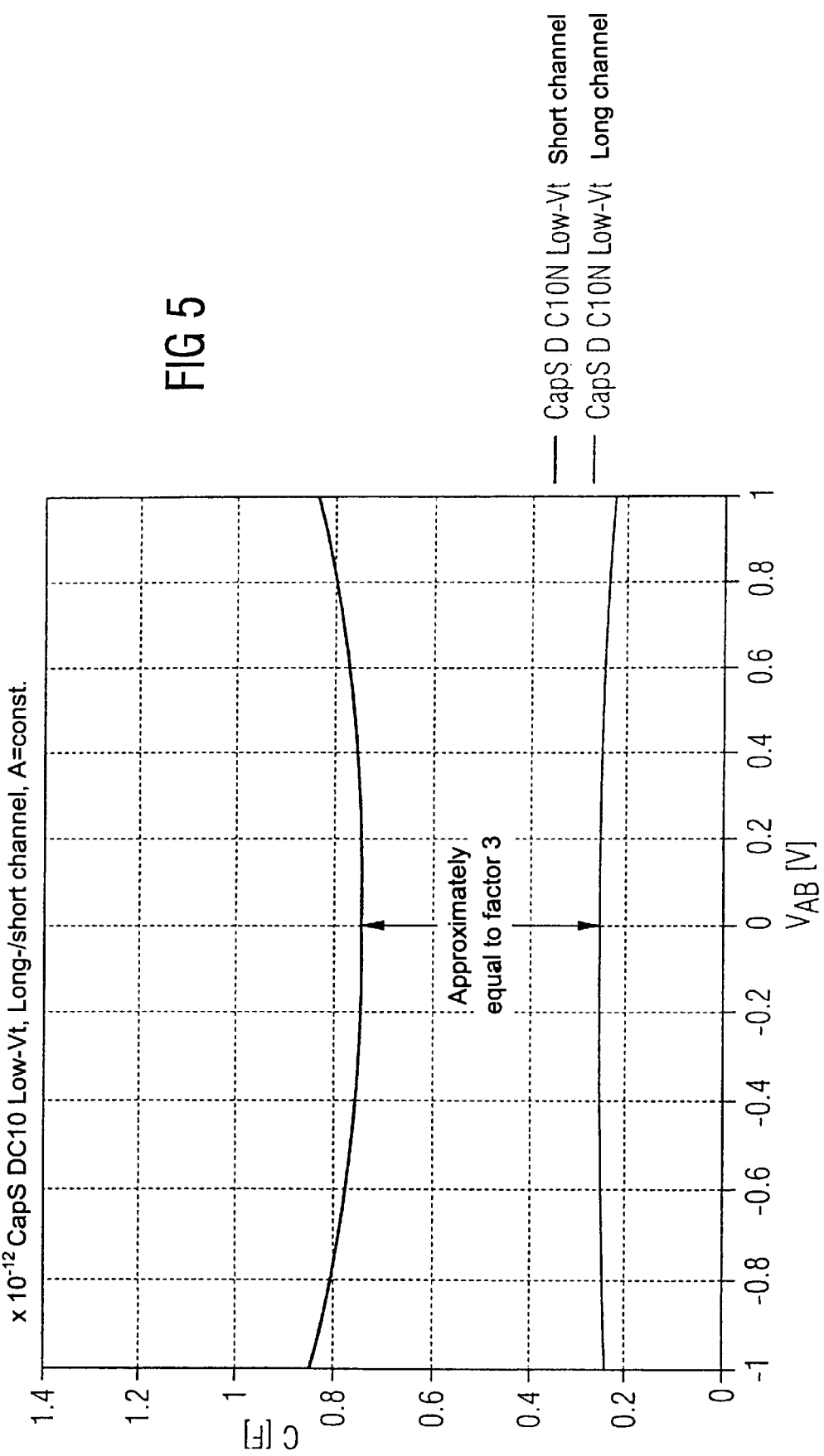
FIG. 5 is a capacitance/voltage diagram for comparing the capacitance obtained with short-channel transistors and with long-channel transistors in the circuit configuration shown in FIG. 4.

For the circuit configuration shown in FIG. 4, FIG. 5 shows the useful capacitance C as a function of the voltage $V_{AB}$ for short-channel transistors in comparison with long-channel transistors. In this case, it becomes clear that, in the case of a voltage $V_{AB}$ equal to zero, the useful capacitance that is obtained with short-channel transistors is larger by at least a factor of three.

FIG. 6 illustrates a second embodiment of the inventive circuit configuration with two MOS transistors T1 and T2 of the same channel type that are reverse-connected in parallel, in which the above-described widened depletion region of the transistors is also used. The bulk terminal of the transistor T2 and the gate terminal G1 of the transistor T1 are connected to a terminal A of the MOS capacitor. The drain and source terminals D1 and S2 of the transistor T1 are connected to a voltage source for a bias voltage V1 and the drain and source terminals D2 and S2 of the transistor T2 are connected to a voltage source for a bias voltage V2. The bulk terminal BLK1 of the transistor T1 is connected to the other terminal B of the MOS capacitor via a voltage source for a displacement voltage V3 and the gate terminal G2 of the transistor T2 is connected to the other terminal B of the MOS capacitor via a voltage source for a displacement voltage V4.

For the circuit configuration shown in FIG. 6, FIG. 7 illustrates the capacitance C as a function of the voltage $V_{AB}$ between the terminals A and B of the capacitor in the case of short-channel transistors and in the case of long-channel transistors. For a voltage $V_{AB}$ equal to 0 volts, the minimum capacitance $C_{min}$ occurs in both cases, and in the case of short-channel transistors, the minimum capacitance $C_{min}$, is approximately four times as large as that in the case of long-channel transistors. Between $V_{AB}$=−0.4 volts and $V_{AB}$=+0.4 volts, this factor is likewise approximately 4, but decreases for voltages of a higher magnitude.

Circuit configurations of this type can be used in all integrated circuits with capacitive elements, such as, for example, in switched-capacitor (SC) filters and in analog-to-digital converters, such as, for example, sigma-delta converters.

We claim:

1. A circuit configuration for forming an MOS capacitor with a low voltage dependence, comprising:
   interconnected terminals;
   a first MOS transistor having a drain terminal and a source terminal; and
   a second MOS transistor having a drain terminal and a source terminal;
   said drain terminal of said first MOS transistor being connected to said source terminal of said first MOS transistor;
   said drain terminal of said second MOS transistor being connected to said source terminal of said second MOS transistor;
   said first MOS transistor being a short-channel transistor having a channel length not greater that 1 $\mu$m;
   said second MOS transistor being a short-channel transistor having a channel length not greater that 1 $\mu$m;
   said first MOS transistor and said second MOS transistor being operated in depletion;
   said first MOS transistor having a given channel type, a bulk terminal, and a gate;
   said second MOS transistor having the given channel type, a bulk terminal, and a gate;
   said first MOS transistor being connected to said second MOS transistor in a manner selected from the group consisting of a first manner and a second manner;
   in said first manner, said bulk terminal of said first MOS transistor and said bulk terminal of said second MOS transistor defining said interconnected terminals and being connected together;
   in said second manner, said gate of said first MOS transistor and said gate of said second MOS transistor defining said interconnected terminals and being connected together;
   said first MOS transistor and said second MOS transistor being reverse-connected in series;
   said first MOS transistor having a depletion region being widened by a first potential difference;
   said second MOS transistor having a depletion region being widened by a second potential difference;
   the first potential difference being connected between said interconnected terminals and said drain terminal of said first MOS transistor; and
   the second potential difference being connected between said interconnected terminals and said drain terminal of said second MOS transistor.

2. A circuit configuration for forming an MOS capacitor with a low voltage dependence, comprising:
   a first terminal and a second terminal;
   a first YIOS transistor having a drain terminal and a source terminal; and
   a second MOS transistor having a drain terminal and a source terminal;
   said drain terminal of said first MOS transistor being connected to said source terminal of said first MOS transistor;
   said drain terminal of said second MOS transistor being connected to said source terminal of said second MOS transistor;
   said first MOS transistor being a short-channel transistor having a channel length not greater that 1 $\mu$m;
   said second MOS transistor being a short-channel transistor having a channel length not greater that 1 $\mu$m;
   said first MOS transistor and said second MOS transistor being operated in depletion;
   said first MOS transistor having a bulk terminal, and a gate;
   said second MOS transistor having a bulk terminal, and a gate;
   said first MOS transistor and said second MOS transistor being reverse-connected in parallel;
   said bulk terminal of said first MOS transistor being connected to said gate of said second MOS transistor and to said second terminal;
   said bulk terminal of said second MOS transistor being connected to said gate of said first MOS transistor and to said first terminal;
   said first MOS transistor having a depletion region being widened by a first potential difference;

said second MOS transistor having a depletion region being widened by a second potential difference;

the first potential difference being connected between said drain terminal of said first MOS transistor and said bulk terminal of said first MOS transistor; and the second potential difference being connected between said drain terminal of said second MOS transistor and said gate terminal of said second MOS transistor.

3. A circuit configuration for forming an MOS capacitor with a low voltage dependence, comprising:

interconnected terminals;

a first MOS transistor having a drain terminal and a source terminal; and a second MOS transistor having a drain terminal and a source terminal;

said drain terminal of said first MOS transistor being connected to said source terminal of said first MOS transistor;

said drain terminal of said second MOS transistor being connected to said source terminal of said second MOS transistor;

said first MOS transistor being a short-channel transistor having a channel length not greater that 1 µm;

said second MOS transistor being a short-channel transistor having a channel length not greater that 1 µm;

said first MOS transistor having a given channel type, a bulk terminal, and a gate;

said second MOS transistor having the given channel type, a bulk terminal, and a gate;

said first MOS transistor being connected to said second MOS transistor in a manner selected from the group consisting of a first manner and a second manner;

in said first manner, said bulk terminal of said first MOS transistor and said bulk terminal of said second MOS transistor defining said interconnected terminals and being connected together;

in said second manner, said gate of said first MOS transistor and said gate of said second MOS transistor defining said interconnected terminals and being connected together;

said first MOS transistor and said second MOS transistor being reverse-connected in series;

said first MOS transistor having a depletion region being widened by a first potential difference;

said second MOS transistor having a depletion region being widened by a second potential difference;

the first potential difference being connected between said interconnected terminals and said drain terminal of said first MOS transistor; and the second potential difference being connected between said interconnected terminals and said drain terminal of said second MOS transistor.

4. A circuit configuration for forming an MOS capacitor with a low voltage dependence, comprising:

a first terminal and a second terminal;

a first MOS transistor having a drain terminal and a source terminal; and a second MOS transistor having a drain terminal and a source terminal;

said drain terminal of said first NOS transistor being connected to said source terminal of said first MOS transistor;

said drain terminal of said second MOS transistor being connected to said source terminal of said second MOS transistor;

said first MOS transistor being a short-channel transistor having a channel length not greater that 1 µm;

said second MOS transistor being a short-channel transistor having a channel length not greater that 1 µm;

said first MOS transistor having a bulk terminal, and a gate;

said second MOS transistor having a bulk terminal, and a gate;

said first MOS transistor and said second MOS transistor being reverse-connected in parallel;

said bulk terminal of said first MOS transistor being connected to said gate of said second MOS transistor and to said second terminal;

said bulk terminal of said second MOS transistor being connected to said gate of said first MOS transistor and to said first terminal;

said first MOS transistor having a depletion region being widened by a first potential difference;

said second MOS transistor having a depletion region being widened by a second potential difference;

the first potential difference being connected between said drain terminal of said first MOS transistor and said bulk terminal of said first MOS transistor; and the second potential difference being connected between said drain terminal of said second MOS transistor and said gate terminal of said second MOS transistor.

* * * * *

UNITED STATES PATENT AND TRADEMARK OFFICE
CERTIFICATE OF CORRECTION

| | | |
|---|---|---|
| PATENT NO. | : 6,700,149 B2 | |
| APPLICATION NO. | : 10/113421 | |
| DATED | : March 2, 2004 | |
| INVENTOR(S) | : Thomas Tille et al. | |

It is certified that error appears in the above-identified patent and that said Letters Patent is hereby corrected as shown below:

Column 6

Line 36, "a first YIOS transistor" should read -- MOS transistor --

Signed and Sealed this
Nineteenth Day of June, 2012

David J. Kappos
*Director of the United States Patent and Trademark Office*